United States Patent [19]
Safari et al.

[11] Patent Number: 5,108,981
[45] Date of Patent: Apr. 28, 1992

[54] FLEXIBLE SUPERCONDUCTING CERAMIC POLYMER COMPOSITES AND METHOD OF MAKING SAME

[75] Inventors: Ahmad Safari, Dayton; Catherine Wilson, Teaneck, both of N.J.

[73] Assignee: Rutgers, The State University, Piscataway, N.J.

[21] Appl. No.: 369,035

[22] Filed: Jun. 19, 1989

[51] Int. Cl.$^5$ .............................. B32B 9/00
[52] U.S. Cl. ...................... 505/1; 505/701; 505/702; 505/703; 505/704; 428/323; 428/408; 428/76; 428/688; 428/901; 428/930
[58] Field of Search ............ 505/1, 701-704; 428/323, 688, 901, 930, 408, 76; 252/500

[56] References Cited

U.S. PATENT DOCUMENTS 3,330,697  7/1967  Pechini ..................... 117/215
4,726,099  2/1988  Card et al. ................. 29/25.35

FOREIGN PATENT DOCUMENTS 1003920  1/1989  Japan.
8809701  12/1988  World Int. Prop. O.

OTHER PUBLICATIONS

"Production of Strontium-Substituted Lanthanum Manganite Perovskite Powder by the Amorphous Citrate Process", by M. S. G. Baythoun et al., Journal of Materials Science, 17 (1982) 2757-2769.

"Production of Conducting Oxide Powders by Amorphous Citrate Process", by D. J. Anderton et al., Powder Metallurgy, 1979, vol. 22, pp. 14-21.

"Novoloid Fibers", by Joseph S. Hayes, Jr., reprinted from Kirk-Othmers: Encyclopedia of Chemical Technology, vol. 16, pp. 125-138.

Primary Examiner—Patrick J. Ryan
Attorney, Agent, or Firm—Lerner, David, Littenberg, Krumholz & Mentlik

[57] ABSTRACT

Superconducting ceramic material is woven into an interconnected structure and embedded in a polymer to produce a flexible, superconducting ceramic material. The polymer also provides protection from moisture. The ceramic polymer composite is fabricated by soaking a carbon fabric in a solution of metal nitrates, ethylene glycol and citric acid to yield a nominal composition of, for example, $YBa_2Cu_3O_{7-x}$. Heat treatment results in the decomposition of the nitrates, organics and carbon fabric to produce an interconnected structure of the superconducting ceramic material which takes the shape of the original carbon fabric on a reduced scale. In addition, the processing conditions yield significant grain orientation. The superconducting grains of the ceramic material align along the direction of the original fabric weave which provides an improvement of the critical current densities.

5 Claims, 8 Drawing Sheets

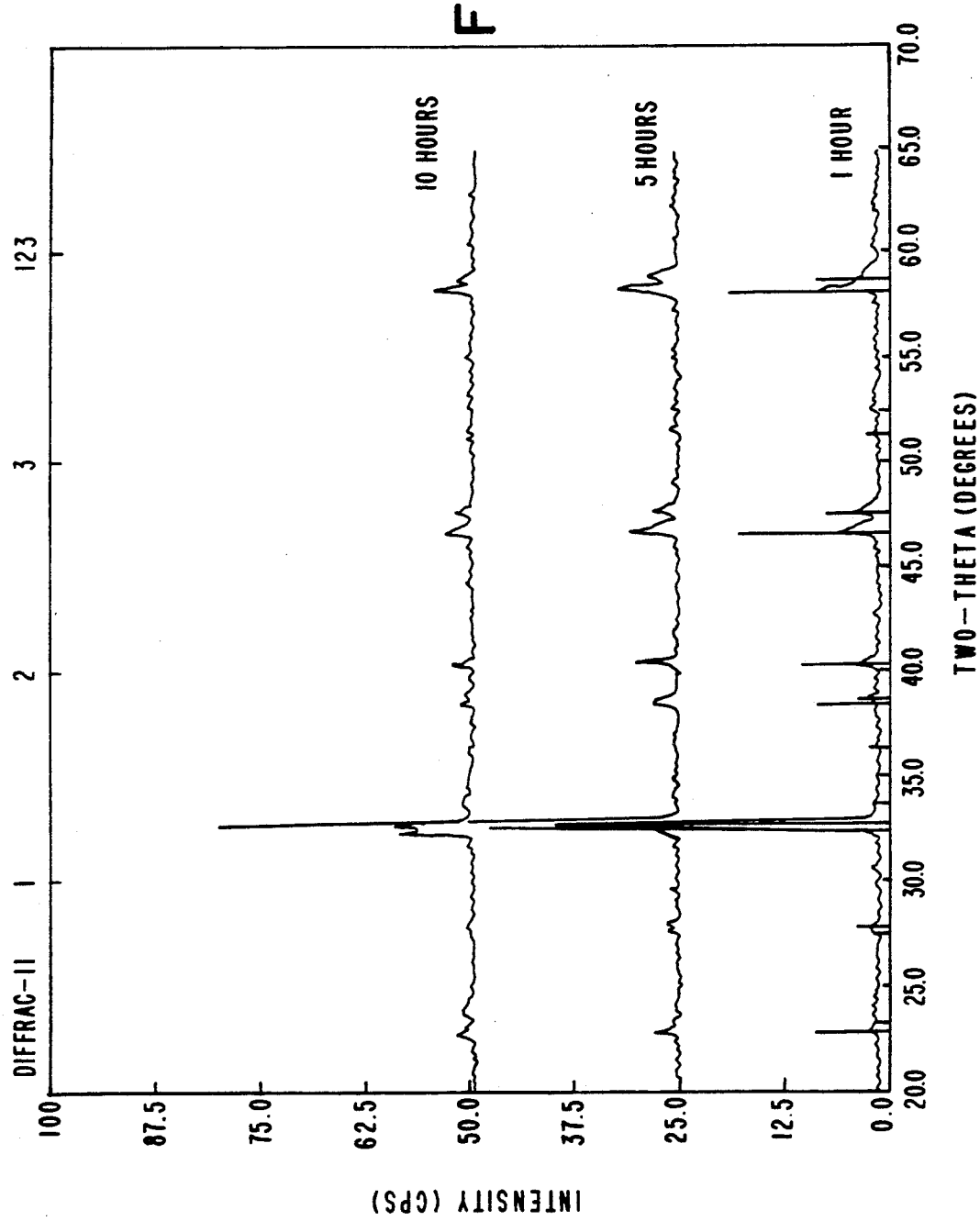

CARBON FABRIC

ACTIVATED CARBON FABRIC

FLEXIBLE SUPERCONDUCTING CERAMIC POLYMER COMPOSITES AND METHOD OF MAKING SAME

BACKGROUND OF THE INVENTION

The present invention relates in general to superconducting ceramic materials, and more specifically, to such materials in the nature of ceramics formed into a woven interconnected structure embedded in a polymer to produce a flexible superconducting ceramic polymer composite.

Superconducting materials evidence a total disappearance of their electrical resistance when they are cooled below a critical temperature $T_C$. For all practical purposes, superconducting material under these circumstances is considered to have a resistance of zero. A vast number of elements, alloys and compounds have so far been discovered to be superconducting, for example, In, Sn, V, Mo, Nb-Zr alloys and $Nb_3Sn$. Transition temperatures of these superconducting materials range from a few thousandths of a degree Kelvin, e.g., for certain Nb-Mo alloys, down to about 18 K for $Nb_3Sn$.

Many applications exist which involve the conduction of electricity, often through inconvenient and awkward paths. Previously, these paths could easily be achieved by using copper wires which are flexible and ductile. However, the desired use of superconductors has been limited to the recently discovered high $T_c$ superconductors, and like other ceramics, are brittle and hard to prepare in the form of wires, flexible ribbons and the like. Zero resistance of these superconducting ceramics are destroyed once fracture has occurred, which eliminates the possibility for bending these materials into the desired structures to provide the requisite electrical paths. Although flexible piezoelectric ceramic polymer composites are generally known from U.S. Pat. No. 4,726,099, there has yet to be any attempt to produce a flexible superconducting ceramic polymer composite. In addition, it has been established that these superconducting ceramics readily react with the ambient atmosphere at typical temperatures, such reactions may be less severe as the purity and density of the materials are improved. Accordingly, the present invention addresses overcoming these problems resulting from the fact that high temperature superconducting ceramics are brittle and incapable of flexure without fracture.

SUMMARY OF THE INVENTION

Flexible superconducting ceramic polymer composites are fabricated from superconducting ceramics formed into a woven interconnected structure which is embedded in a polymer to provide flexibility while maintaining its superconducting properties. The polymer also serves to provide protection for the superconducting ceramic from the harmful effects of moisture and the like. The proposed preferred superconducting ceramic polymer composite exhibits zero resistance in two directions at 89 K. It is contemplated that these superconducting ceramic polymer composites will remain superconducting following flexure due to the interconnective nature of the superconducting ceramics. That is, electricity can be transported in the superconducting ceramic even when the material is bent, as the current can continue to be transported across the ceramic despite flexure. In fact, if the ceramic composite does fracture in one area, there will be many alternate paths for electricity to follow due to the interconnective nature of the ceramic.

In accordance with one aspect of the present invention, the flexible superconducting ceramic polymer composite can be used in situations where one needs to carry resistance through a difficult geometry. The ceramic composite can be bent to fit certain applications while other superconducting ceramics are brittle and inflexible. The superconducting ceramic polymer composites of the present invention can also be used in magnetic shielding applications where magnetic shielding is required for difficult geometries.

In accordance with another aspect of the present invention, when used for zero resistance applications, electrical contacts can be fixed to the interconnective superconducting ceramic prior to embedding in the polymer. The ceramic structure may then be embedded into thermally curable polymer which is subsequently cured. The superconducting ceramic polymer composite can then be bent into the necessary configurations for utilization as a superconductor with zero resistance. When used for magnetic shielding applications, no contacts need be made, i.e., the ceramic composite is formed into the desired shape and used as such.

In accordance with another aspect of the present invention, there is achieved the enhancing of the limited values of critical current densities presently being achieved in bulk superconductors by the alignment of the grains within the ceramic material. Under the processing conditions for the manufacture of the superconducting ceramic polymer composites of the present invention, these ceramic composites show significant grain alignment along the direction of the weave by producing oriented, polycrystalline superconducting fibers. It is known that grain alignment improves current densities. However, prior known methods for achieving grain alignment usually involved quite difficult processes which utilized extremely high magnetic fields or extrusion of the precursor powders. The present invention, on the other hand, produces grain orientation as sintering occurs, thereby eliminating certain previously used processing steps.

In accordance with one embodiment of the present invention, there is disclosed a method of producing flexible superconducting ceramic polymer composites by immersing carbon material into a solution of metal salts or complexes capable of forming oxides having superconducting properties thereby forming an impregnated carbon material, transforming the metal salts or complexes to their oxides and removing the carbon material thereby forming a ceramic material having superconducting properties, and coating the ceramic material with a polymer to provide a flexible superconducting ceramic polymer composite.

In accordance with another embodiment of the present invention, there is provided a flexible superconducting ceramic polymer composite as a woven ceramic structure having superconducting properties embedded in a polymer.

In accordance with another embodiment of the present invention, there is provided a flexible superconducting ceramic polymer composite including a ceramic structure formed from carbon material impregnated with a solution of metal salts or complexes capable of forming oxides having superconducting properties, the carbon material being removed by oxidation and the metal salts or complexes being reduced to their oxides, and a polymer coating the ceramic structure.

BRIEF DESCRIPTION OF THE DRAWINGS

The above description, as well as further objects, features and advantages of the present invention will be more fully understood with reference to the following detailed description of flexible superconducting ceramic polymer composites, when taken in conjunction with the accompanying drawings, wherein:

FIG. 2 shows the x-ray diffraction pattern of woven ceramic after heat treatment in air for a) 1 hour, b) 5 hours and c) 10 hours, and wherein indexed lines of the orthorhombic phase of $YBa_2Cu_3O_{7-x}$ are shown;

FIG. 3 is an SEM micrograph of woven ceramic produced from carbon fabric (ACC507) at low solution viscosity heated for 10 hours at 930° C.;

DETAILED DESCRIPTION

Figure 1:
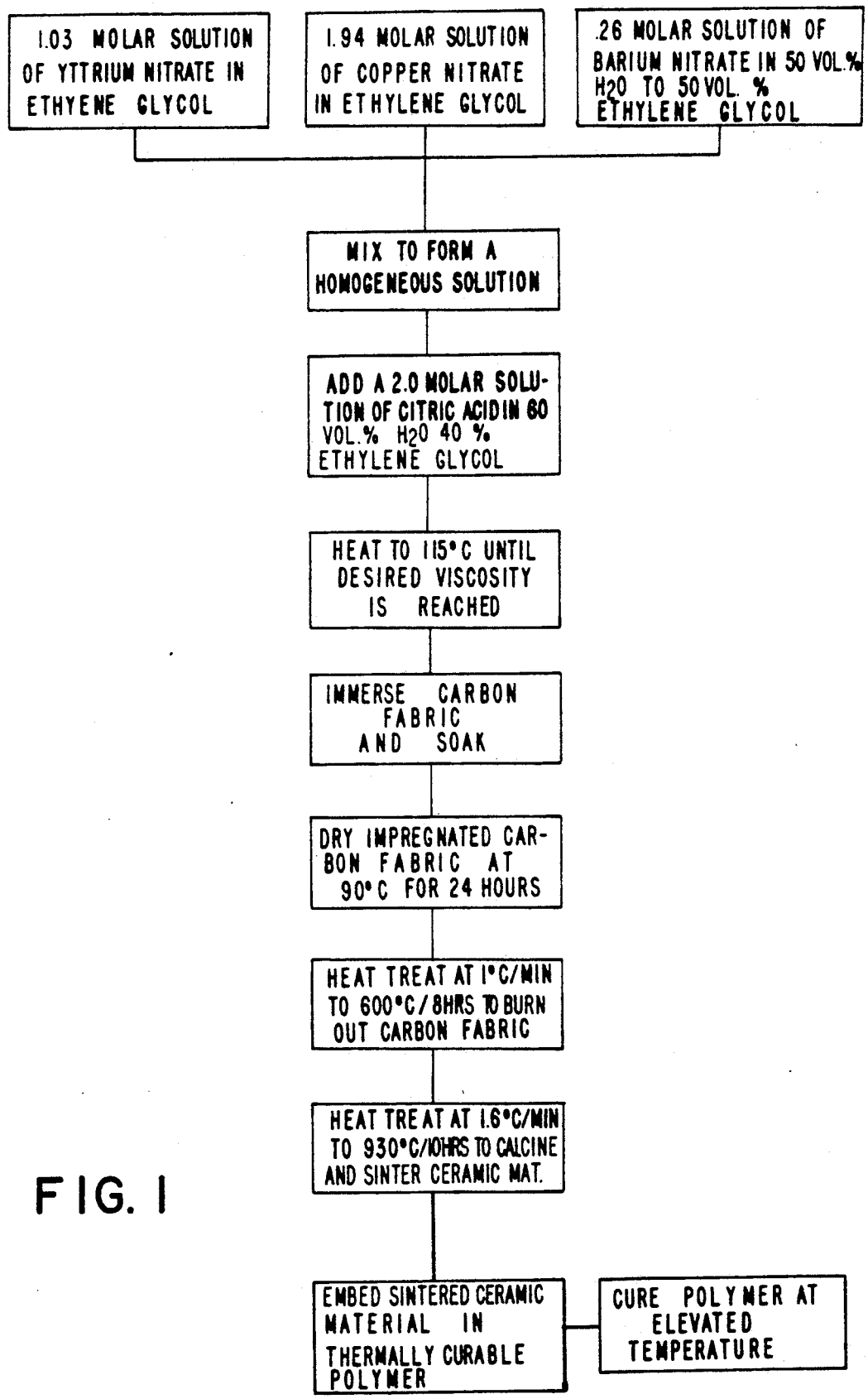
FIG. 1 is a schematic flow diagram of the process for manufacturing a flexible superconducting ceramic polymer composite in accordance with one embodiment of the present invention.

The present invention describes a fabrication procedure where superconducting ceramic materials are formed into a woven structure and subsequently embedded into a polymer matrix to provide flexibility in an otherwise brittle material. The superconducting ceramic structure is formed by soaking a carbon fabric in a solution of metal nitrates, ethylene glycol, and citric acid. Heat treatment results in the decomposition of the nitrates and organics, and oxidation of the carbon fabric to CO and $CO_2$ to give the formation of an interconnected woven ceramic structure. The woven ceramic structure is then embedded in thermally curable polymer and subsequently cured to provide flexibility to the resulting ceramic polymer composite, in addition, to protect the ceramic from the environmental effects of moisture and the like.

Generally, activated carbon materials are used as the intermediate support for the formation of the superconducting ceramic polymer composites. However, it is also contemplated that unactivated carbon materials may also be used. The activated carbon material may be provided in a variety of forms, for example, non-woven or woven mats. In place of woven mats of activated carbon fibers, individual activated carbon fibers, continuous or chopped, can be used to produce the superconducting ceramic polymer composites of the present invention. In addition, any structure containing activated carbon materials, e.g., fibers, can also be used.

A composite solution of metal salts and/or complexes to yield the nominal composition of the superconducting ceramic is prepared using one or more known techniques. For example, the solutions may be prepared in accordance with the procedures disclosed in U.S. Pat. No. 3,330,697 or by the amorphous citrate method as known from the article entitled "Production of Conducting Oxide Powders by Amorphous Citrate Process" by D. J. Anderton and F. R. Sale, *Powder Metallurgy*, 1979, vol. 22, pp. 14–21. The homogeneous solution of the metal salts and/or complexes are heated between 80°–140° C., and preferably about 115° C., until the desired viscosity is achieved. The higher the viscosity, the greater the ability to impregnate the carbon material with a sufficient quantity of metal salts and/or complexes to form the resulting ceramic structure. The carbon material is immersed into the metal salt and/or complex solutions maintained at a temperature within the range of about room temperature to about 100° C., and preferably, about room temperature to about 75° C. The carbon material is allowed to soak in the prepared solution from between 5 to 30 minutes, and preferably, about 10 minutes.

The impregnated carbon material is dried at elevated temperature, for example, at 90° C. for 24 hours, to remove the excess solvent. The dried impregnated carbon material is slowly and evenly heated to an initial temperature within the range of about 500° to 700° C., and preferably about 600° C. to completely burn out all residual carbon. The resulting material is then slowly and evenly heated to a temperature within the range of about 850°–940° C., and preferably about 930° C., and held thereat for a sufficient time, for example, 10 hours, to convert the metal salts or complexes to their oxides or mixed oxides and to sinter the ceramic material into a woven structure.

The resulting superconducting ceramic structure is vacuum impregnated with a solution which can be polymerized to form a supporting polymer matrix for the ceramic material. The polymer usable to form the supporting matrix for the superconducting ceramic materials are well known to those skilled in the art, for example, silicon, epoxy resins, urethanes and the like.

The formed flexible superconducting ceramic polymer composite can be bent into the necessary configuration for utilization as a superconductor with zero resistance. When used for zero resistance applications, electrical contacts can be made to the interconnective ceramic material prior to embedding in the polymer. On the other hand, when used for magnetic shielding applications, no contacts are required. In this regard, the flexible superconducting ceramic polymer composite is formed into the desired shape and directly used as such.

The metal salts and/or complexes utilized are those known to yield crystalline structures having superconducting properties. Such salts and complexes are preferably those from which concentrated solutions can be made to produce high yields of ceramics. Examples of metals, who salts or complexes can be used, include bismuth, barium, calcium, copper, lead, thallium, yttrium, strontium, any rare earth metal and mixtures thereof. Preferable combinations are (a) bismuth, strontium, calcium and copper, (b) bismuth, lead, strontium, calcium and copper, (c) thallium, copper and calcium, and (d) barium, copper and any rare earth metal. The preferred combination includes the combination of yttrium, barium and copper.

Solvents suitable for use for making the metal salts and/or complex solutions include, for example solution of ethylene glycol, nitric acid, acidic acid, ammonia with water and the like. It is contemplated that other solvents, both organic and inorganic may be used as long as they can dissolve the metal salts and/or complexes to produce the desired concentration.

Generally, any soluble salt and/or complex of the metals can be used. Preferred systems include solutions which contain all of the metals being utilized in the same solution in their desired concentrations. The metals may be deposited in a single step or a sequence of steps. The metal salt and/or complex solutions may be the same in each step or different. Each of the solutions may contain one or more metal salts and/or complexes.

The following examples, while not intended to be limiting on the scope of the present invention, are provided for the purpose of illustration only. The examples should not be construed as limiting the invention in any way as variations of the invention are possible which do not depart from the spirit and scope of the claims as appended hereto.

EXAMPLE 1

In accordance with the preferred embodiment of the present invention, superconducting ceramic $YBa_2Cu_3O_{7-x}$ polymer composites were fabricated by embedding a woven structure of this superconducting ceramic into a thermally curable polymer.

Carbon Fabric—The carbon fabric used in accordance with the preferred embodiment was produced by American Kynol, Inc. The precursors to the carbon fabric are novoloid fibers which are cross-linked phenolic-aldehyde fibers typically prepared by acid-catalyzed cross-linking of a melt-spun nonvolac resin with formaldehyde. See, for example, J. S. Hayes, Jr., "Novoloid Fibers," reprinted from Kirk-Othmers: Encyclopedia of Chemical Technology, Vol. 16, pp.125-138. These fibers were then heat treated in an inert atmosphere to produce carbon through carbonization. In addition to the regular carbon fabric, activated carbon fabric was formed by a one step process which combines both carbonization and activation. The degree of activation can vary but may approach 3000 $m^2/g$. The carbon fabric was soaked in a 3% solution of $H_2O_2$ for ½ hour and rinsed with distilled water in order to enhance the coupling effect between the solution and the carbon fabric. Both the activated and unactivated carbon fabric was used, as well as two types of fabric weave in both these cases. The designation ACC509 and ACC507 refers to the activated carbon fabric, ACC509 consisting of a thicker weave than the ACC507 activated carbon fabric. Reference to the CC509 and CC507 carbon fabrics indicate fabric of similar weave but which have not been activated through the process described above.

Solution Preparation—A solution to yield the nominal composition $YBa_2Cu_3O_{7-x}$ where $x=0.4$ was prepared by the technique disclosed in U.S. Pat. No. 3,330,697 using 99.99% $Y(NO_3)_3 5H_2O$ from Aldrich and 99% $Ba(NO_3)_2$ and 99% $Cu(NO_3)_2.5H_2O$ from Fisher Scientific. The detailed experimental procedure for the solution preparation is shown in FIG. 1. This technique for solution preparation was chosen instead of the amorphous citrate method because a more stable solution results at room temperature and there is no precipitation of $Ba(NO_3)_2$.

Specifically, the respective solutions were prepared as (a) a 1.03 molar solution of yttrium nitrate in ethylene glycol, (b) a 1.94 molar solution of copper nitrate in ethylene glycol and (c) a 0.26 molar solution of barium nitrate in 50 vol. % $H_2O$ to 50 vol. % ethylene glycol. These solutions were mixed in the ratio of one mole of yttrium to two moles of barium to three moles of copper to form a homogeneous solution to which there was added a 2.0 molar solution of citric acid in 60% vol. % $H_2O$ to 40% vol. % ethylene glycol. Water was evaporated from the resulting solution at 115° C. to attain the desired viscosity. The carbon fabric was soaked for 10 minutes in the resulting solution and then dried at 90° C. for 24 hours. Samples were produced using both a high viscosity and a low viscosity solution. Solution viscosity was controlled by the amount of water which was evaporated. The low viscosity solution was characterized by its ability to drip off a glass rod while the high viscosity solution could not drip. Samples of the impregnated carbon fabric were then heat treated to 600° C./8 hrs. in air at 1.0° C./min to allow complete burnout of all residual carbon, and then heated to 850° C. and 930° C., respectively, at 1.6° C./min. and held there for 1, 5, and 10 hours for calcining of the metal salts and sintering of the ceramic material.

An indium-mercury amalgam was used to make contacts to the ceramic material after which indium solder was used to secure the contacts. Another method employed for making electrical contacts utilized silver paint. This method was also sufficient because once embedded in the polymer, the contacts become mechanically secure. The woven ceramic structure was then embedded in Eccogel 1365-80 thermally curable polymer made by Emerson Cummings, Inc. The polymer was cured at 80° C. for 8 hours.

Results—Referring to FIG. 2, x-ray diffraction of samples produced using ACC509 fabric and heat treated at 930° C. for 1, 5 and 10 hours show the presence of the orthorhombic superconducting phase of $YBa_2Cu_3O_{7-x}$ for all three samples. Samples heated to 850° C. for as much as 10 hours did not densify and could not be handled easily without crumbling to a powder. However, the samples heated at 930° C. were not as fragile and could be handled without fracture. Therefore, further discussion is limited to those samples which have been heated to 930° C. It is also to be noted that the high surface area of this ceramic material allows the formation of the orthorhombic phase without an additional anneal in oxygen.

SEM micrographs of samples made with activated carbon fabric (ACC507) with a low viscosity solution and heated for 10 hours can be seen in FIG. 3. The interconnective nature of the superconducting phase can be clearly seen as well as the grain structure and morphology. Well defined elongated grains of 10–50 microns are present. Grains barely show evidence of fusing but are closely packed.

Figure 4:
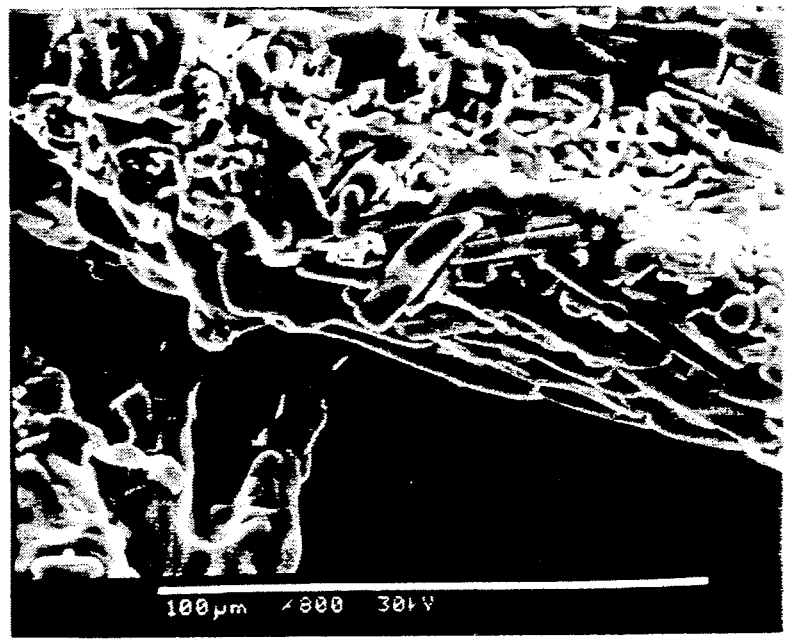
FIGS. 4 and 5 are respective SEM micrographs of samples prepared from both activated carbon fabric (ACC507) and regular carbon fabric (CC507)
Figure 5:
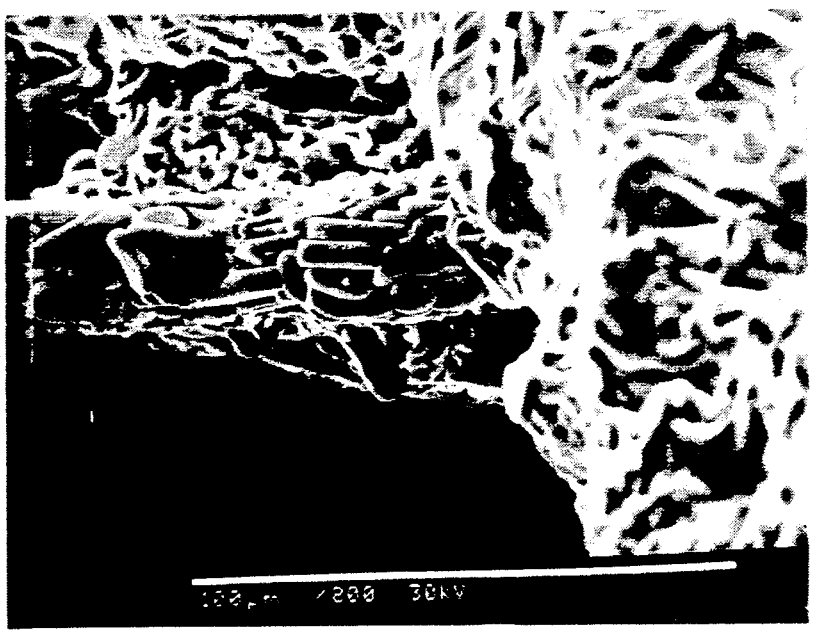

FIG. 4 and 5 show that both the activated and unactivated carbon fabric of the same type of weave yields samples with similar microstructure. Therefore, the remainder of the results will refer to samples prepared only from activated carbon fabric.

Figure 6:
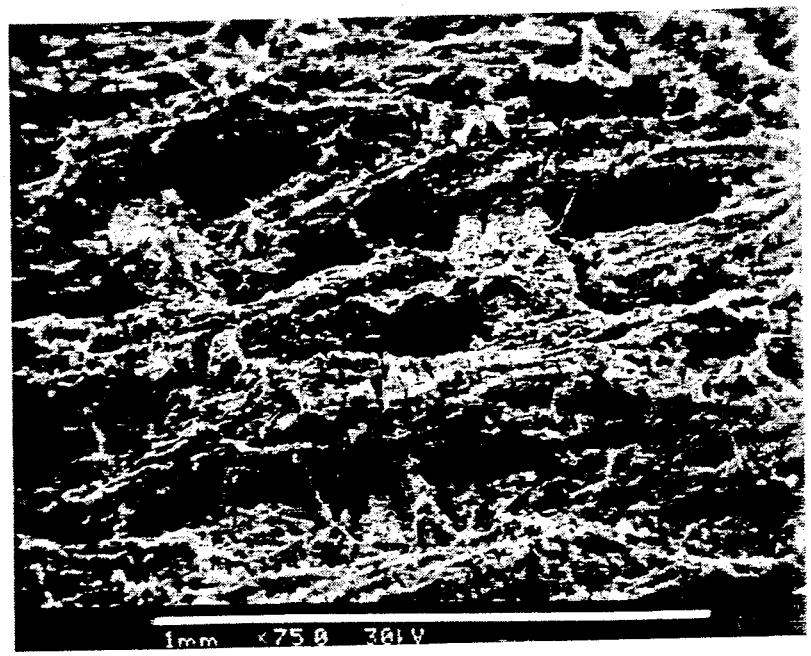
FIGS. 6 and 7 are SEM micrographs of samples prepared from activated carbon fabric (ACC509) and high solution viscosity, wherein the samples were heated at 930° C. for 10 hours.
Figure 7:
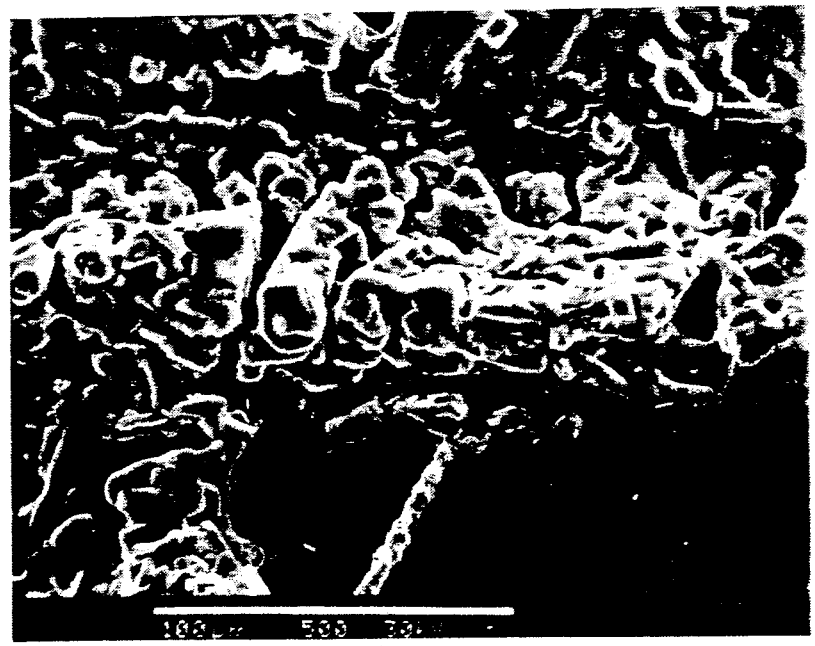

Samples were also prepared using a different carbon fabric (ACC509) and a higher solution viscosity. SEM micrographs of such samples heated for 10 hours at 930° C. are shown in FIGS. 6 and 7. These samples show cracking in the weave and do not evidence any grain alignment. While samples prepared from the same fabric at lower solution viscosity do not show such cracking of the weave (See FIGS. 8 and 9), it is contemplated that solution viscosity during the preparation procedure might effect the final microstructure of the samples.

Figure 8:
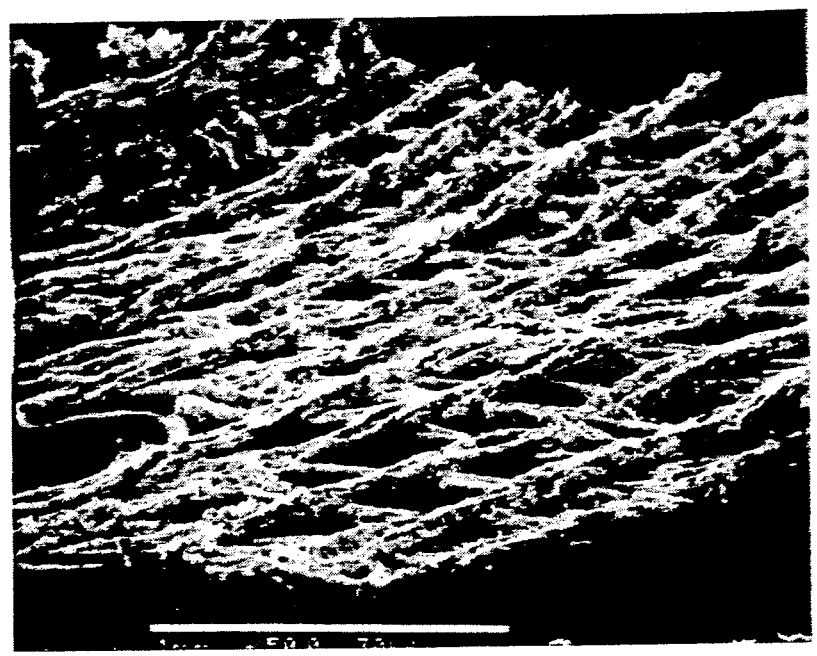
FIGS. 8 and 9 are SEM micrographs of samples prepared from activated carbon fabric (ACC509) and low solution viscosity, wherein the samples were heated at 930° C. for 10 hours.
Figure 9:
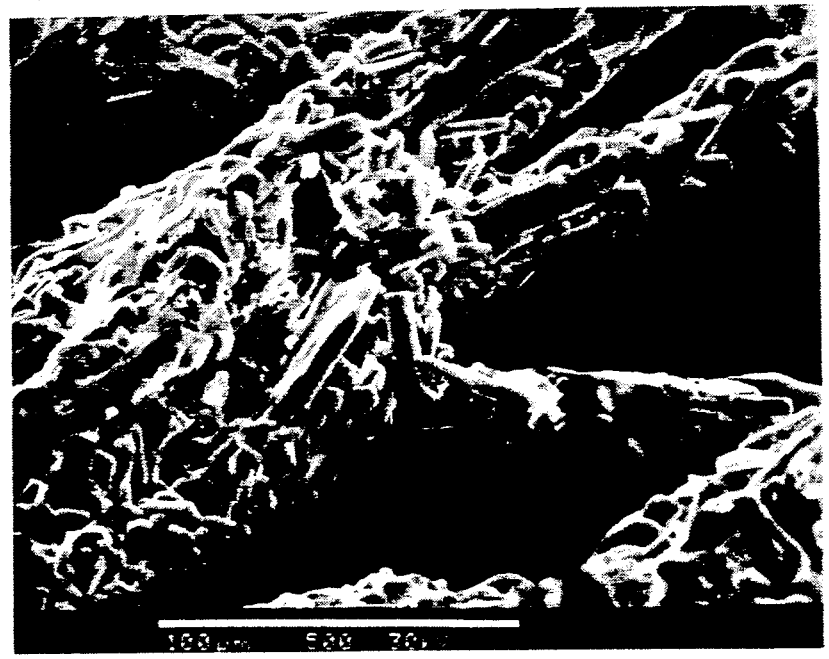
Figure 10:
FIGS. 10 and 11 are SEM micrographs of samples prepared from activated carbon fabric (ACC509) and low solution viscosity, wherein the samples were heated at 930° C. for 1 hour.
Figure 11:
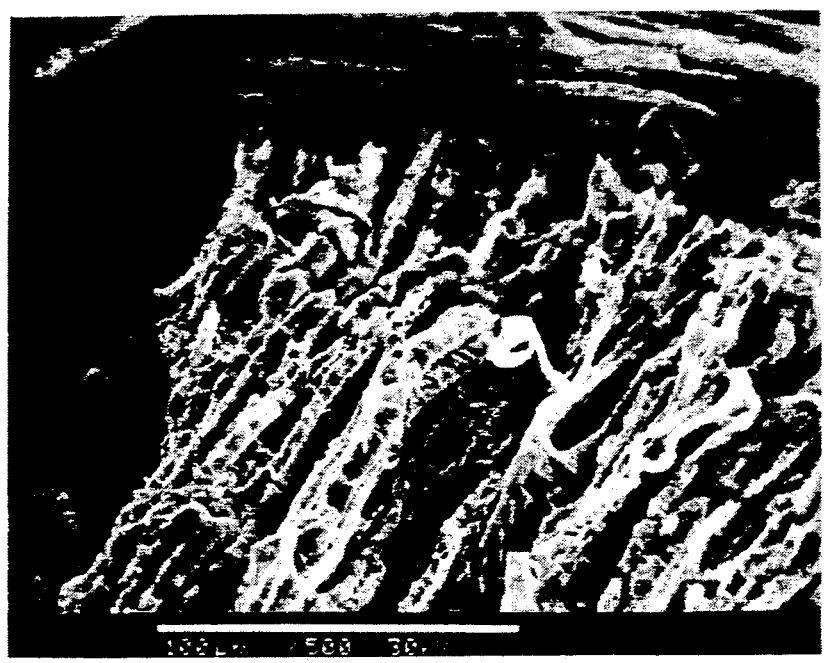

Another feature observed of the woven structure is the apparent tendency of grain alignment along the direction of the weave. FIGS. 10 and 11 show SEM micrographs of samples prepared from carbon fabric type ACC509 at a low viscosity for only 1 hour. In these samples there is no grain formation, however, the structure of individual strands in the original fabric weave has been preserved. In comparison, FIGS. 8 and 9 show samples prepared under the same conditions but heated for 10 hours at 930° C. In this case grain formation has occurred, many of which have formed along the direction of the fabric weave.

Grain alignment is an area of interest in the processing of high temperature ceramic superconductors due to an increase in current densities associated with such alignment. There are several ways in which to attain grain alignment, for example, through extrusion processing or by exposing superconducting powders to high magnetic fields. However, both these processes involve aligning powders before sintering, while the process used in accordance with the present invention causes grain alignment during sintering. Therefore, the process of the present invention eliminates various steps to attain such alignment. Although critical currents are maximum in the a and b directions and the grains are aligning in the c direction, it is contemplated that such alignment will still increase values for current densities.

Figure 12:
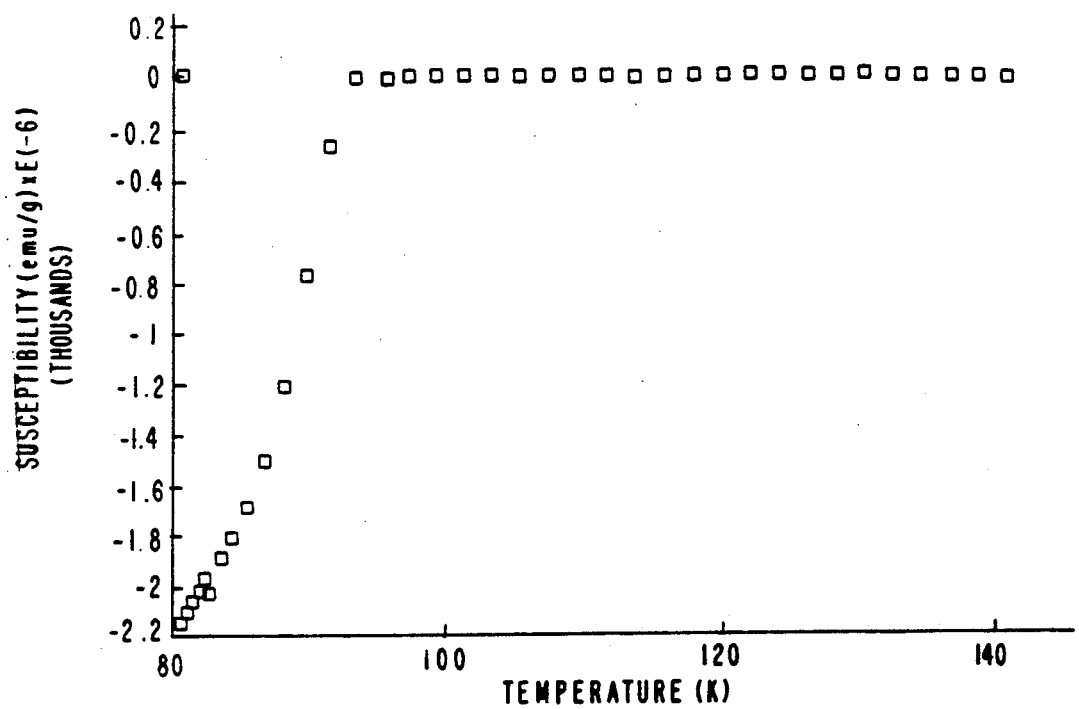
FIG. 12 is a graph illustrating magnetic susceptibility vs temperature for woven ceramic after being embedded in a polymer.
Figure 13:
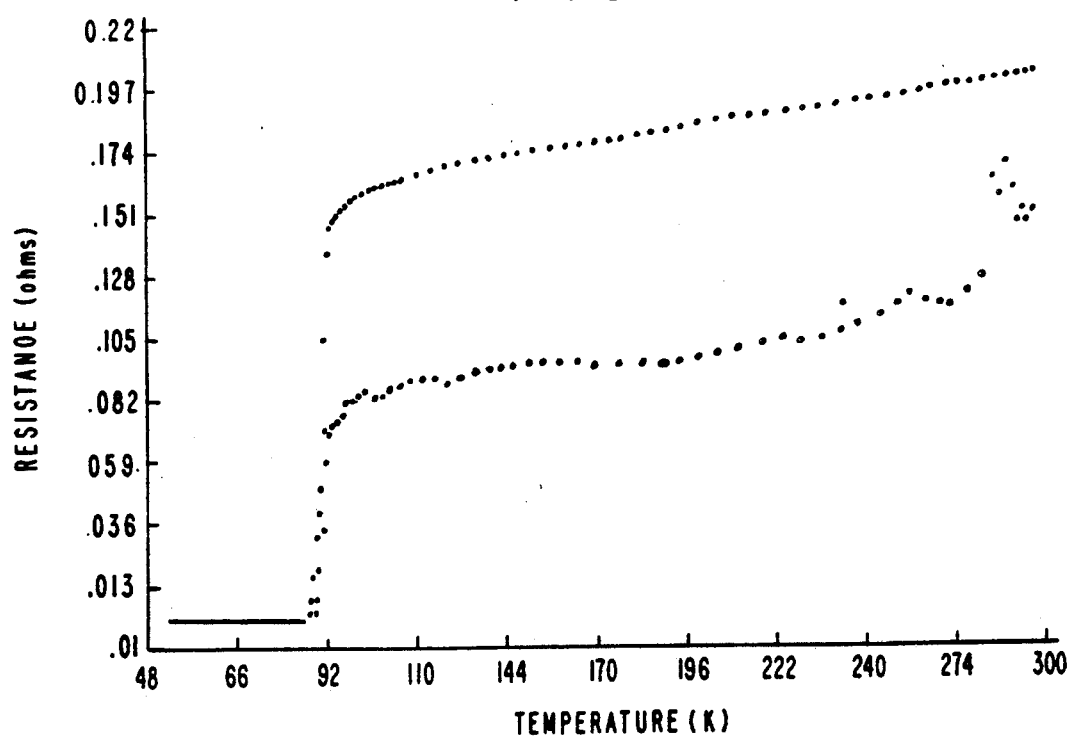
FIG. 13 is a graph illustrating resistance vs temperature for two woven superconducting composites prepared by the same processing conditions.

In order to determine whether the samples exhibited superconducting behavior after being embedded in the polymer, magnetic susceptibility was measured. FIG. 12 shows that the sample still exhibited magnetic shielding properties despite the polymer. Sample resistance was also measured and can be seen in FIG. 13 for two samples of similar preparation conditions. In both cases there is a sharp transition to zero resistance at approximately 89 K.

EXAMPLE 2

Figure 14:
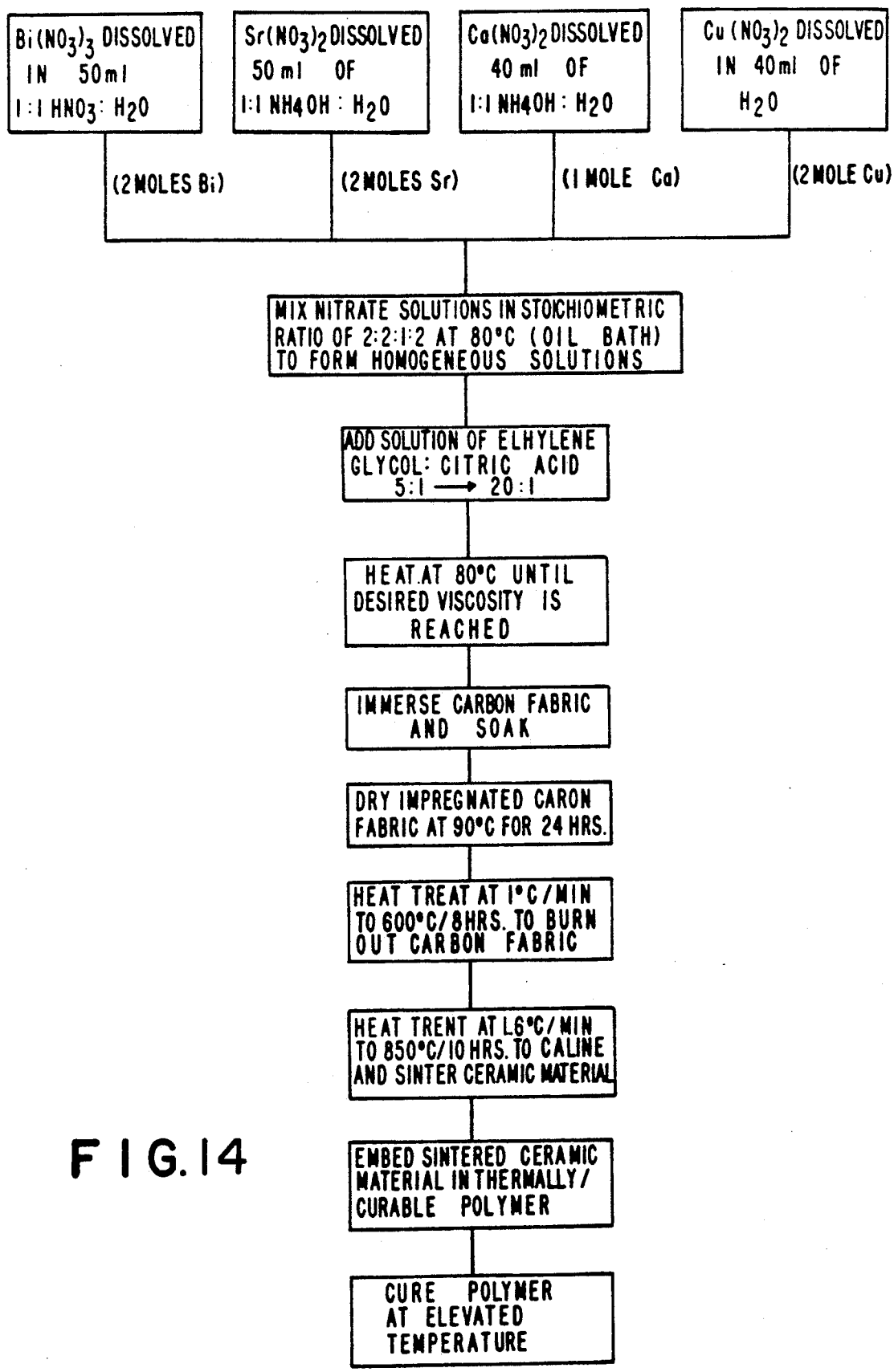
FIG. 14 is a schematic flow diagram of the process for manufacturing a flexible superconducting ceramic polymer composite in accordance with another embodiment of the present invention.

In accordance with another embodiment of the present invention, superconducting ceramic $Bi_2Sr_2CaCu_2O_x$ was fabricated in bulk form from which there may be fabricated a ceramic polymer composite in accordance with the process as described with respect to Example 1. A solution to yield the nominal composition $Bi_2Sr_2CaCu_2O_x$ where $x=8$ was prepared by the previous technique using the nitrates of bismuth, strontium, calcium and copper. The detailed experimental procedure for the solution preparation is shown in FIG. 14. Specifically, the respective solutions were prepared as (a) $Bi(NO_3)_3$ dissolved in 50 mls 1:1 $HNO_3:H_2O$, (b) $Sr(NO_3)_2$ dissolved in 50 mls of 1:1 $NH_4OH:H_2O$, (c) $Ca(NO_3)_2$ dissolved in 50 mls of 1:1 $NH_4OH:H_2O$ and, (d) $Cu(NO_3)_2$ dissolved in 40 mls of $H_2O$. The individual nitrate solutions in the stoichiometric ratios of 2:2:1:2 (Bi:Sr:Ca:Cu) were mixed at 80° C. in an oil bath to form a homogeneous solution. The complexation was achieved by using a solution of ethylene glycol and citric acid in the ratio of 5:1-20:1, i.e., ethylene glycol to citric acid. Water was evaporated from the resulting solution at 80° C. to attain the desired viscosity. Calcination is carried out at 850° C. to form ceramic $Bi_2Sr_2CaCu_2O_x$ material in bulk form. The bulk ceramic material evidenced superconducting properties at 75 K.

The ceramic $Bi_2Sr_2CaCu_2O_x$ may be formed into a superconducting ceramic polymer composite in accordance with the method of the present invention as described with reference to Example 1. In this regard, activated carbon fabric can be prepared as described, soaked for about 10 minutes in the nitrate solution and then dried at 90° C. for 24 hours. A low viscosity solution is preferred. Samples of the impregnated carbon fabric can then be heat treated within the range of 550°-700° C., preferably at about 600° C., at the heating rate of 1° C. per minute to allow complete burnout of the residual carbon fabric. The resulting material will then be heated at the rate of about 1.6° C. per minute to about 850° C. to calcine the metal salts and to sinter the ceramic material. Sintering for a period of 10 hours is contemplated to result in densification of the ceramic material to form a ceramic structure having sufficient mechanical strength to be easily handled without fracture. The resulting sintered ceramic material may be embedded in thermally curable polymer and contacted with indium-mercury amalgam.

Although the invention herein has been described with references to particular embodiments, it is to be understood that these embodiments are merely illustrative of the principles and application of the present invention. It is therefore to be understood that numerous modifications may be made to the embodiments and that other arrangements may be devised without departing from the spirit and scope of the present invention as defined by the claims.

What is claimed is:

1. A flexible superconducting ceramic polymer composite comprising superconducting ceramic material formed by impregnating carbon material having a selected form with a solution of metal salts or complexes capable of forming oxides having superconducting properties, said ceramic material comprising metal oxides selected from the groups consisting of (i) bismuth, strontium, calcium and copper, (ii) bismuth, lead, strontium, calcium and copper, (iii) thallium, calcium and copper, (iv) barium, copper and at least one rare earth metal, and (v) yttrium, barium and copper, said carbon material being removed by oxidation and said metal salts or complexes being reduced to their oxides forming said ceramic material thereat, and a polymer coating said ceramic material.

2. The composite of claim 1, wherein said ceramic material comprises metal oxides selected from the group consisting of bismuth, barium, calcium, copper, lead, thallium, yttrium strontium, rare earth metals and mixtures thereof.

3. The composite of claim 1, wherein said ceramic material is selected from the group consisting of $YBa_2Cu_3O_{6.6}$ and $Bi_2Sr_2CaCu_2O_8$.

4. The composite of claim 1, wherein said ceramic material has a woven form as a result of said carbon material being in the form of a woven fabric.

5. The composite of claim 1, wherein said ceramic material provides a plurality of electrically conductive superconducting paths.

* * * * *